United States Patent
Wijetunga et al.

(10) Patent No.: US 12,033,683 B2
(45) Date of Patent: Jul. 9, 2024

(54) METHODS AND CIRCUITS FOR POWER MANAGEMENT OF A MEMORY MODULE

(71) Applicant: Rambus Inc., San Jose, CA (US)

(72) Inventors: Panduka Wijetunga, Thousand Oaks, CA (US); Aws Shallal, Cary, NC (US); Joey M. Esteves, Tracy, CA (US)

(73) Assignee: Rambus Inc., San Jose, CA (US)

( * ) Notice: Subject to any disclaimer, the term of this patent is extended or adjusted under 35 U.S.C. 154(b) by 177 days.

(21) Appl. No.: 17/725,026

(22) Filed: Apr. 20, 2022

(65) Prior Publication Data

US 2022/0358989 A1 Nov. 10, 2022

Related U.S. Application Data

(60) Provisional application No. 63/185,906, filed on May 7, 2021.

(51) Int. Cl.
*G11C 11/40* (2006.01)
*G11C 11/4074* (2006.01)

(52) U.S. Cl.
CPC .............................. *G11C 11/4074* (2013.01)

(58) Field of Classification Search
CPC ......... G11C 11/4074; G11C 8/12; G11C 5/04; G11C 5/147
See application file for complete search history.

(56) References Cited

U.S. PATENT DOCUMENTS

| | | | |
|---|---|---|---|
| 5,587,648 A * | 12/1996 | Jinbo | G11C 5/147 323/269 |
| 9,122,289 B2 * | 9/2015 | Howes | G05F 1/46 |
| 10,126,791 B2 | 11/2018 | Beeston et al. | |
| 10,916,274 B2 | 2/2021 | Lee | |
| 2003/0201673 A1 * | 10/2003 | Sim | G11C 11/4074 307/80 |
| 2006/0174140 A1 * | 8/2006 | Harris | G11C 5/04 713/300 |
| 2007/0001750 A1 * | 1/2007 | Jin | G11C 11/406 327/540 |
| 2009/0167419 A1 * | 7/2009 | Sakaguchi | H02M 3/073 327/536 |
| 2012/0008431 A1 * | 1/2012 | Lee | G11C 11/406 327/392 |
| 2018/0018094 A1 * | 1/2018 | Ha | G06F 1/3287 |

(Continued)

OTHER PUBLICATIONS

JEDEC, "JEDEC Standard: PMIC50x0 Management IC Specification Rev 1.8", JESD301-1, Version 1.8, Dec. 18, 2020. 207 pages.

(Continued)

*Primary Examiner* — Khamdan N. Alrobaie
(74) *Attorney, Agent, or Firm* — Silicon Edge Law Group LLP; Arthur J. Behiel

(57) ABSTRACT

A power-management integrated circuit (PMIC) is installed on a memory module to optimize power use among a collection of memory devices. The PMIC includes external power-supply nodes that receive relatively high and low supply voltages. Depending on availability, the PMIC uses one or both of these supply voltages to generate a managed supply voltage for powering the memory devices. The PMIC selects between operational modes for improved efficiency in dependence upon the availability of one or both externally provided supply voltages.

20 Claims, 3 Drawing Sheets

(56) References Cited

U.S. PATENT DOCUMENTS

2020/0028435 A1* 1/2020 Kim ................... H02M 3/1584
2023/0108987 A1* 4/2023 Bawa ..................... H02M 1/36
                                                              323/271

OTHER PUBLICATIONS

Texas Instruments, "TTPS6521815 User-Programmable Power Management IC (PMIC) With 6 DC/DC Converters, 1 LDO, and 3 Load Switches," published by Texas Instruments Nov. 2019 and revised Feb. 2021, 89 pages.

Wikipedia, "Serial presence detect," retrieved from https://en.wikipedia.org/windex.php?title=Serial_presence_detect&oldid=1013770520, last edited on Mar. 23, 2021, 21 pages.

Yuan, Bing et al., "Switch Size Control Circuit in Wide-Load PWM/PFM DC-DC Buck Converters", IEEE, 2016 International Symposium on Integrated Circuits (ISIC), Singapore, 2016, doi: 10.11109/ISICIR.2019.7829740. 3 pages.

* cited by examiner

US 12,033,683 B2

METHODS AND CIRCUITS FOR POWER MANAGEMENT OF A MEMORY MODULE

BACKGROUND

A memory module is a printed-circuit board, also called a wiring board, that physically supports integrated-circuit (IC) memory devices that store data and other IC devices that support the memory devices. Memory modules permit easy installation and replacement in computational systems that require memory, commonly personal computers, workstations, and servers. Conductive traces (wires) on the wiring board convey power and information signals from one or more module connectors to and between the various ICs. Among the ICs, memory modules can include a power-management IC (PMIC) that, as the name implies, manages the power distributed to the remaining ICs on the module.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
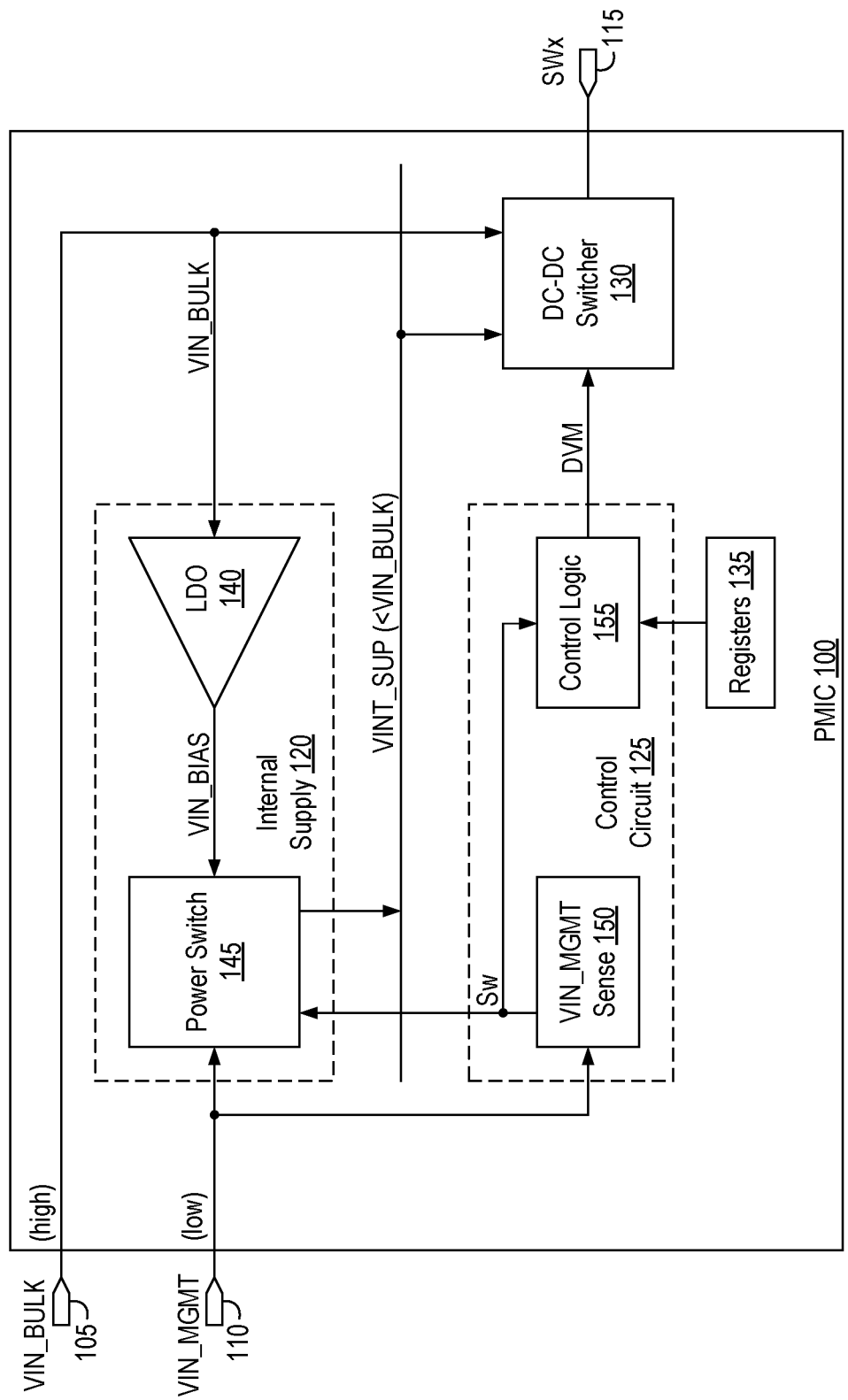
FIG. 1 depicts a power-management integrated circuit (PMIC) 100 that can be installed on a memory module to optimize power use among a collection of memory ICs and supporting devices.

FIG. 1 depicts a power-management integrated circuit (PMIC) 100 that can be installed on a memory module to optimize power use among a collection of memory ICs and supporting devices. PMIC 100 includes an external input node 105 that receives a relatively high supply voltage VIN_BULK (for "bulk input voltage") of e.g. 12 V from the computational system within which PMIC 100 is embedded. A second external input node 110 optionally receives a lower supply voltage VIN_MGMT (for "management input voltage") from the computational system. PMIC 100 uses one or both of these supply voltages to generate an external supply voltage SWx on an external output node 115 for distribution throughout devices on the module. PMIC 100 supports two power modes, one that optimizes power usage when both high and low external supply voltages VIN_BULK and VIN_MGMT are present and another that optimizes power usage absent the lower external supply voltage VIN_MGMT.

PMIC 100 includes an internal power supply 120, control circuitry 125, a switching DC-DC converter 130, and registers 135. Internal power supply 120 produces an internal supply voltage VINT_SUP of e.g. 3.3 V from low supply voltage VIN_MGMT, if that voltage is present, and otherwise from high supply voltage VIN_BULK. Deriving voltage VINT_SUP from voltage VIN_MGMT is preferred if voltage VIN_MGMT is available because more power is lost in converting the relatively higher voltage VIN_BULK to internal supply voltage VINT_SUP. A voltage regulator 140, a low-dropout regulator (LDO) in this example, converts high supply voltage VIN_BULK to a lower voltage VIN_BIAS. A switch 145 selects lower voltage VIN_BIAS for internal supply voltage VINT_SUP if external voltage VIN_MGMT is unavailable and otherwise selects voltage VIN_MGMT.

Control circuit 125 controls the state of power switch 145 of supply 120. A voltage sense circuit 150 asserts binary switch signal Sw when voltage VIN_MGMT is present, causing power switch 145 to direct voltage VIN_MGMT to node VINT_SUP. Control logic 155 responsively asserts a dual-voltage-mode signal DVM to DC-DC converter 130. As detailed in connection with FIG. 2, DC-DC converter 130 provides external supply voltage SWx using different circuitry in the different modes. The circuitry is selected to reduce PMIC power consumption when the lower external voltage VIN_MGMT is available. Registers 135 can be loaded externally by e.g. a remote memory controller to enable mode selection in the manner detailed herein.

Figure 2:
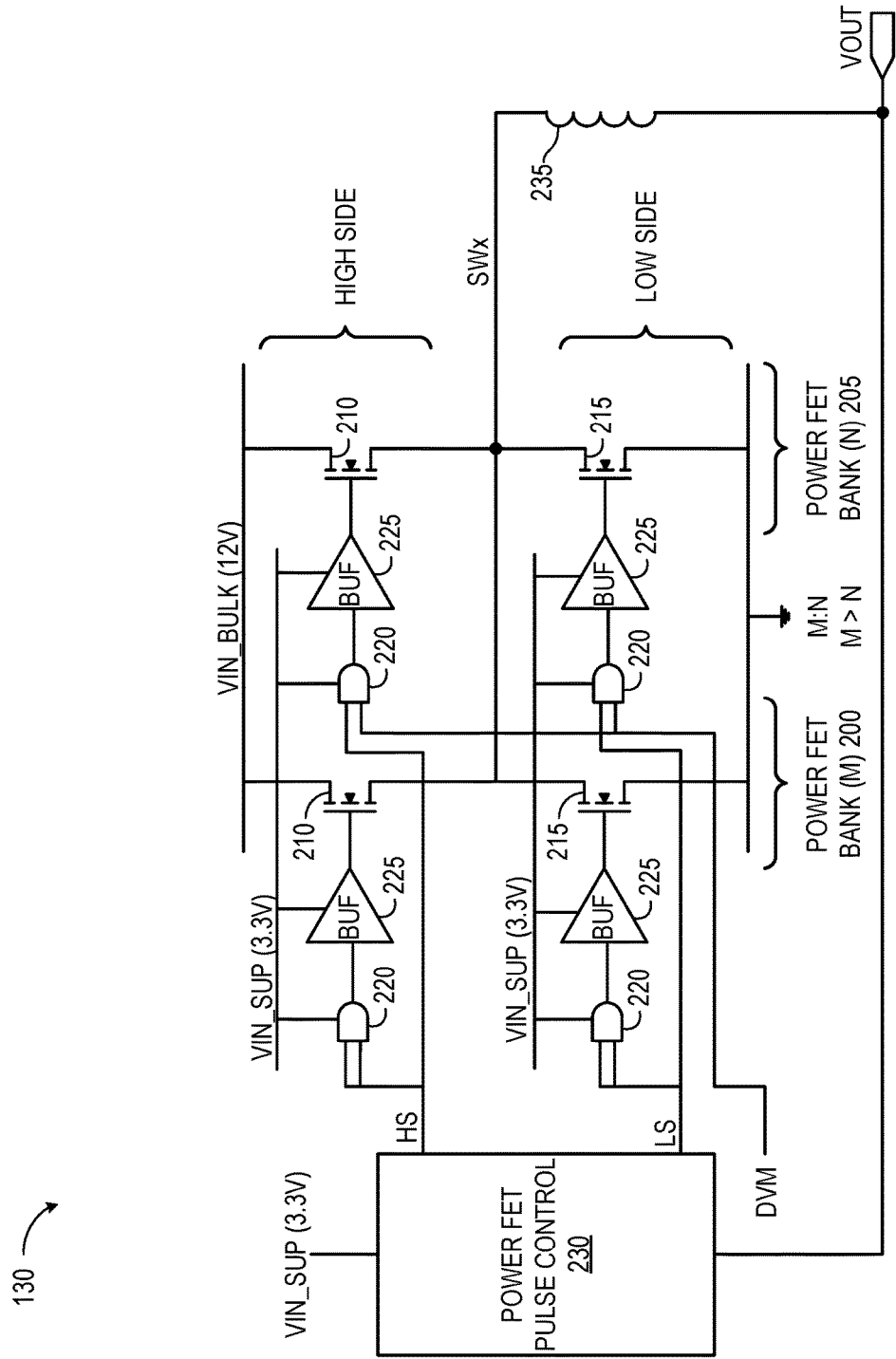
FIG. 2 details DC-DC converter 130 in accordance with one embodiment.

FIG. 2 details DC-DC converter 130 in accordance with one embodiment. Converter 130 includes two banks 200 and 205 of high-side power field-effect transistors (FETS) 210 and low-side FETs 215, each bank with related AND gates 220 and buffers 225 that together drive the gates (control terminals) of the FETs. While only one instance of a FET pair and drive circuitry is shown for each of banks 200 and 205, a practical embodiment can include M FET pairs in bank 200 and N FET pairs in bank 205, M and N being 6,000 and 1,000 in one example. With reference to bank 205, dual-voltage-mode signal DVM is asserted to allow the AND gates 220 to pass signals to the buffers 225 that drive the gates of the FETs. Signal DVM thus serves as an enable signal for power FET bank 205.

Assuming signal DVM is asserted, both power FET banks 200 and 205 function similarly. Pulse-control circuitry 230 modulates the pulse width and frequencies of a pair of signals high-side HS and low-side LS that stimulate respective drive circuitry to drive the gates of respective FETs 210 and 215. Banks 200 and 205 of FETs 210 and 215, thus modulated, produce an output voltage on node SWx of e.g. 12V. An inductance 235, which can be a discrete component on the module, delivers a supply voltage VOUT to be distributed across the memory module (FIG. 3) to power various ICs (e.g., memory devices). Supply voltage VOUT or voltage SWx is fed back to pulse-control circuit 230. Control circuit 230 alters the frequencies and pulse widths of signal HS and LS to minimize the error of supply voltage VOUT.

Signal DVM is asserted with management voltage VIN_MGMT (FIG. 1) is asserted, in which case both power FET banks 200 and 205 are operational. Should voltage VIN_MGMT be unavailable, however, signal DVM is deasserted and power FET bank 205 consequently disabled. Pulse control circuitry 230 and FET bank 200 work as in the dual-voltage mode to maintain the voltage on node SWx. The overall power used by PMIC 100 is reduced, however, relative to the case in which both banks 200 and 205 are in use absent voltage VIN_MGMT.

Returning to FIG. 1, internal supply 120 provides internal supply voltage VINT_SUP to switcher 130 more efficiently when supply signal VIN_MGMT is available. Power switch 145 simply delivers management voltage VIN_MGMT as signal VINT_SUP with little power loss. Absent supply signal VIN_MGMT, however, power switch 145 directs a different 3.3V potential VIN_BIAS as signal VINT_SUP. LDO 140 derives signal VIN_BIAS from 12V signal VIN_BULK. This derivation is lossy, with approximately three fourths of the power delivered from LDO 140 lost as heat. Any reductions in supply current for signals VIN_BIAS and the similar internal supply voltage VINT_SUP therefore result in an approximately four-fold reduction in power consumed by internal supply 120.

Back to FIG. 2, FET banks 200 and 205 consume power from the external 12V supply node VIN_BULK, whereas the circuitry that drives the FET banks consume power from the 3.3V internal supply node VIN_SUP. As noted above, supplying node VIN_SUP with power is less efficient in the single-supply mode because power is lost in converting the 12V supply voltage VIN_BULK to 3.3V. Signal DVM is thus deasserted in the single-supply mode to disable FET bank 205, and thus reduce the draw from internal supply node VIN_SUP, and consequently from LDO 140. Disabling a fraction of the power FETs increases power draw from external supply node VIN_BULK by the remaining FETs of banks 200 beyond what was required by both banks 200 and 205 but the net result from this increase and the decrease in LDO 140 is an overall reduction in power usage for PMIC 100.

The number and size of the FETs in banks 200 and 205 are selected to optimize power usage for the single-voltage and dual-voltage modes. Some embodiments allow for more granularity of adjustment (e.g., more banks, different numbers of FETs per bank) to allow PMIC 100 to be optimized across a broader range of use cases. In one embodiment, for example, an external controller can load registers 135 with a value or values that select operational modes to optimize for both the number of external supply voltages and the output voltage, current, or both from the PMIC.

Figure 3:
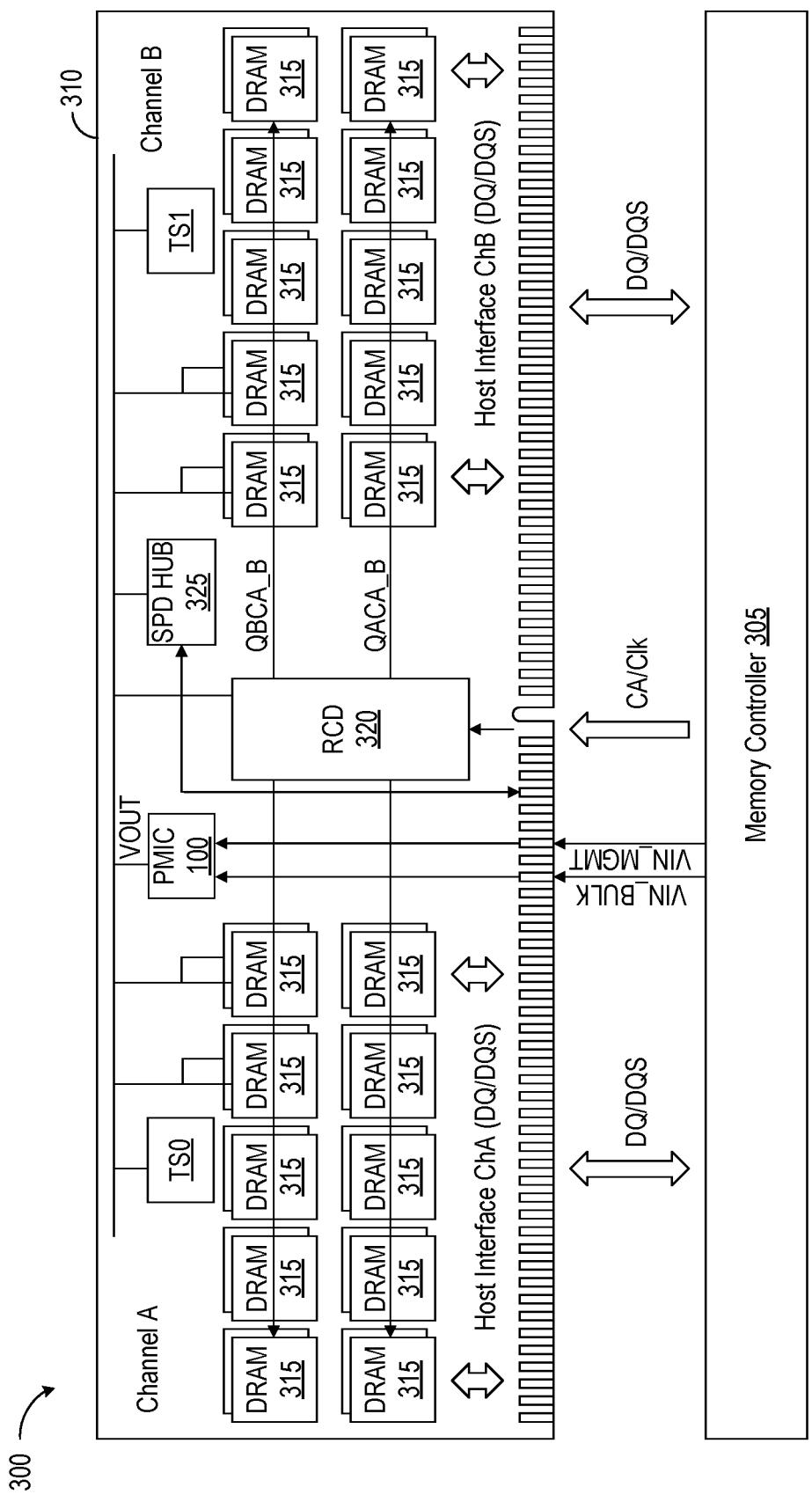
FIG. 3 depicts a memory system 300 in which a memory-controller component 305 communicates with a memory module 310 with DRAM devices 315 powered using a PMIC 100.

FIG. 3 depicts a memory system 300 in which a memory-controller component 305 communicates with a memory module 310 via ten pairs of nibble-wide primary data ports (DQ) each accompanied by a complementary strobe port DQS that provides timing for writing to and reading from dynamic, random-access memory (DRAM) devices 315. Controller component 305 also conveys command and address signals CA, accompanied by a clock signal Clk, to a registering clock driver (RCD) 320. RCD 320 manages memory transactions (e.g. read, write, and refresh) based on instructions from controller component 305. DRAM devices 315 are divided into two channels A and B for reasons that are beyond the scope of this disclosure. RCD 320 relays module commands received from controller component 305 via primary command/address interface CA to each memory device 315 via one of two secondary command interfaces QBCA_B and QACA_B for channel B and a similar but unlabeled pair of command interfaces for channel A. RCD 320 and DRAM devices 315 are well understood by those of skill in the art so a detailed discussion is omitted.

Memory component 305 includes a serial-presence-detect (SPD) hub 325, a pair of temperature sensors TS0 and TS1, and PMIC 100. SPD hub 325 allows controller 305 to access information about module 310. When system 300 is powered on, controller 305 initiates a power-on self-test (POST) that configures various module and chip parameters. SPD hub 325 allows controller 305 to know what memory is present, and what memory timings to use to access the memory. PMIC 100 derives supply voltage VOUT from power-supply voltage VIN_BULK and, if available, the lower power-supply voltage VIN_MGMT. The components powered by PMIC 100 include all the DRAM devices 315, though some of the supply connections are omitted for clarity. Powered devices are also provided with a ground, though these connections too are omitted.

Hub 325 can include an integrated temperature sensor and receives temperature data from both temperature sensors TS0 and TS1. Temperature readings can be shared with e.g. hub 325 or PMIC 100, either of which can include registers for communicating temperature information with memory controller 305. Memory controller 305, the host in the example of FIG. 3, is responsible for taking any specific action responsive to temperature information.

In the foregoing discussion, PMIC 100 selects an operational mode based on a sensing or absence of supply voltage VIN_MGMT. In this context, a supply voltage is absent from a node if power provided to that node is insufficient to maintain an operational voltage under the requisite load. In other embodiments, controller 305 can select modes by loading a register. In memory systems in which voltage VIN_MGMT is sometimes available, PMIC 100 can provide an option for active voltage monitoring. The speed of voltage monitoring, and thus the associated power consumption, can be reduced when PMIC 100 is powered by voltage VIN_BIAS rather than voltage VIN_MGMT because turning on voltage VIN_MGMT does not disrupt PMIC performance. Where voltage VIN_MGMT is known to be always present or absent, the mode of internal supply 120 can be selected ahead of module installation.

In the description and drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

Circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

An output of a process for designing an integrated circuit, or a portion of an integrated circuit, comprising one or more of the circuits described herein may be a non-transitory computer-readable medium such as, for example, flash memory, a magnetic tape, or an optical or magnetic disk. The non-transitory computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

Mode selection may include, for example and without limitation, loading a control value into a register or other storage circuit in response to a host instruction, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A power-management integrated circuit (PMIC) comprising:
    a first external input node to receive a first supply voltage;
    a second external input node to receive a second supply voltage lower than the first supply voltage;
    an internal supply node to deliver an internal supply voltage lower than the first supply voltage;
    an internal power supply coupled to the first and second external input nodes and the internal supply node, the internal power supply to derive the internal supply voltage from the first supply voltage in a first power mode and from the second supply voltage in a second power mode;
    a voltage converter coupled to the first external input node and the internal supply node, the voltage converter to produce an external supply voltage from the first supply voltage and the internal supply voltage; and
    an external output node coupled to the voltage converter to deliver the external supply voltage from the PMIC.

2. The PMIC of claim 1, further comprising a control circuit coupled to the second external input node and the internal power supply, the control circuit to select between the first power mode and the second power mode responsive to the second supply voltage.

3. The PMIC of claim 2, wherein the control circuit selects the first power mode responsive to a presence of the second supply voltage.

4. The PMIC of claim 2, the control circuit to sense an absence of the second supply voltage and, in the absence of the second supply voltage, to place the internal power supply in the first power mode.

5. The PMIC of claim 1, the internal power supply including a voltage regulator to down regulate the first supply voltage to the internal supply voltage.

6. The PMIC of claim 1, the voltage converter including:
    first power-switching elements coupled to the first external input node and powered by the first supply voltage;
    first drive circuitry coupled to the internal supply node and powered by the internal supply voltage, the first drive circuitry to drive the first power-switching elements in the first power mode and the second power mode;
    second power-switching elements coupled to the first external input node and powered by the first supply voltage;
    second drive circuitry coupled to the internal supply node and powered by the internal supply voltage, the second drive circuitry to drive the second power-switching elements; and
    selection circuitry to disable the second drive circuitry in the first power mode.

7. The PMIC of claim 6, at least one of the first power-switching elements and the second power-switching elements comprising a field-effect transistor.

8. The PMIC of claim 6, further comprising a pulse-control circuit coupled to the first and second drive circuitry, the pulse-control circuit to issues pulses to the first and second drive circuitry responsive to the external supply voltage.

9. A memory module comprising:
    a wiring board;
    memory devices mounted to the wiring board, each memory device having a memory-device power terminal; and
    a power-management integrated circuit (PMIC) having:
        a first external input node to receive a first supply voltage;
        a second external input node to receive a second supply voltage lower than the first supply voltage;
        an internal supply node to deliver an internal supply voltage lower than the first supply voltage;
        an internal power supply coupled to the first and second external input nodes and the internal supply node, the internal power supply to derive the internal supply voltage from the first supply voltage in a first power mode and from the second supply voltage in a second power mode;
        a voltage converter coupled to the first external input node and the internal supply node, the voltage converter to produce an external supply voltage; and
        an external output node coupled between the voltage converter and, via the wiring board, to the memory-device power terminals, the external output node to deliver the external supply voltage from the PMIC to the memory devices.

10. The memory module of claim 9, further comprising a clock-driver integrated circuit having a clock-driver power terminal coupled to the external output node of the PMIC to receive the external supply voltage.

11. The memory module of claim 9, the PMIC further comprising a control circuit coupled to the second external input node and the internal power supply, the control circuit to select between the first power mode and the second power mode responsive to the second supply voltage.

12. The memory module of claim 11, wherein the control circuit selects the first power mode responsive to a presence of the second supply voltage.

13. The memory module of claim 11, the control circuit to sense an absence of the second supply voltage and, in the absence of the second supply voltage, to place the internal power supply in the first power mode.

14. The memory module of claim 9, the voltage converter including:
- first power-switching elements coupled to the first external input node and powered by the first supply voltage;
- first drive circuitry coupled to the internal supply node and powered by the internal supply voltage, the first drive circuitry to drive the first power-switching elements in the first power mode and the second power mode;
- second power-switching elements coupled to the first external input node and powered by the first supply voltage;
- second drive circuitry coupled to the internal supply node and powered by the internal supply voltage, the second drive circuitry to drive the second power-switching elements; and
- selection circuitry to disable the second drive circuitry in the first power mode.

15. The memory module of claim 14, at least one of the first power-switching elements and the second power-switching elements comprising a field-effect transistor.

16. The memory module of claim 14, the PMIC further comprising a pulse-control circuit coupled to the first and second drive circuitry, the pulse-control circuit to issues pulses to the first and second drive circuitry responsive to the external supply voltage.

17. A method of supplying power to memory devices on a memory module, the method comprising:
- receiving a first supply voltage;
- distinguishing between a presence of a second supply voltage lower than the first supply voltage and an absence of the second supply voltage;
- in the presence of the second supply voltages, deriving a third supply voltage from the first supply voltage and the second supply voltage;
- in the absence of the second supply voltage, deriving the third supply voltage from the first supply voltage; and
- distributing the third supply voltage to the memory devices.

18. The method of claim 17, further comprising, after deriving the third supply voltage from the first supply voltage and the second supply voltage, sensing the absence of the second supply voltage.

19. The method of claim 18, wherein the deriving the third supply voltage from the first supply voltage in the absence of the second supply voltage is responsive to the sensing.

20. The method of claim 17, further comprising monitoring the third supply voltage in the absence of the second supply voltage at a first speed and monitoring the third supply voltage in the presence of the second supply voltage at a second speed higher than the first speed.

* * * * *